(12) United States Patent
Choi

(10) Patent No.: US 7,358,574 B2
(45) Date of Patent: Apr. 15, 2008

(54) SEMICONDUCTOR DEVICE HAVING SILICIDE-BLOCKING LAYER AND FABRICATION METHOD THEREOF

(75) Inventor: Chee Hong Choi, Busan (KR)

(73) Assignee: Dongbu Electronics Co., Ltd., Seoul (KR)

( * ) Notice: Subject to any disclaimer, the term of this patent is extended or adjusted under 35 U.S.C. 154(b) by 120 days.

(21) Appl. No.: 11/320,303

(22) Filed: Dec. 29, 2005

(65) Prior Publication Data

US 2006/0145270 A1    Jul. 6, 2006

(30) Foreign Application Priority Data

Dec. 30, 2004    (KR) ............. 10-2004-0117036

(51) Int. Cl.
*H01L 31/00* (2006.01)
(52) U.S. Cl. ............. 257/384; 257/506; 257/E23.157; 438/300
(58) Field of Classification Search ............. 257/384, 257/382, 396, 506, E23.157, E23.158, E29.156, 257/E29.28; 438/586, 630
See application file for complete search history.

(56) References Cited

U.S. PATENT DOCUMENTS

| | | | | |
|---|---|---|---|---|
| 4,987,465 A * | 1/1991 | Longcor et al. ............. 257/357 |
| 6,004,838 A * | 12/1999 | Ma et al. ............. 438/200 |
| 6,018,185 A * | 1/2000 | Mitani et al. ............. 257/374 |
| 6,046,087 A * | 4/2000 | Lin et al. ............. 438/279 |
| 6,051,472 A * | 4/2000 | Abiko et al. ............. 438/296 |
| 6,140,691 A * | 10/2000 | Gardner et al. ............. 257/506 |
| 6,162,675 A * | 12/2000 | Hwang et al. ............. 438/241 |
| 6,187,664 B1 * | 2/2001 | Yu ............. 438/627 |
| 6,406,987 B1 * | 6/2002 | Huang ............. 438/595 |
| 6,420,770 B1 * | 7/2002 | Xiang et al. ............. 257/506 |
| 6,777,759 B1 * | 8/2004 | Chau et al. ............. 257/377 |
| 7,148,097 B2 * | 12/2006 | Yu et al. ............. 438/199 |
| 2002/0041002 A1 * | 4/2002 | Gonzalez et al. ............. 257/410 |
| 2002/0119627 A1 * | 8/2002 | Nakamura ............. 438/294 |
| 2003/0036236 A1 * | 2/2003 | Benedetto et al. ............. 438/294 |
| 2004/0173856 A1 * | 9/2004 | Park ............. 257/382 |

* cited by examiner

*Primary Examiner*—W. David Coleman
(74) *Attorney, Agent, or Firm*—Finnegan, Henderson, Farabow, Garrett & Dunner, L.L.P.

(57) ABSTRACT

A semiconductor device having a silicide-blocking layer is provided. The device includes a field oxide layer defining an active region, source/drain regions in the active region of a substrate, a gate oxide layer and a gate electrode on the substrate between the source/drain regions, dielectric spacers on sidewalls of the gate electrode, and a silicide layer on both the gate electrode and the source/drain regions. The device also includes the silicide-blocking layer formed over the border between the field oxide layer and the source/drain regions. The silicide-blocking layer covers edges of the source/drain regions, obstructing the extension of the silicide layer.

6 Claims, 4 Drawing Sheets

SEMICONDUCTOR DEVICE HAVING SILICIDE-BLOCKING LAYER AND FABRICATION METHOD THEREOF

CROSS REFERENCE TO RELATED APPLICATIONS

This U.S. non-provisional application claims priority under 35 U.S.C. §119 from Korean Patent Application No. 2004-117036, which was filed in the Korean Intellectual Property Office on Dec. 30, 2004, the contents of which are incorporated by reference herein in its entirety.

BACKGROUND OF THE INVENTION

1. Technical Field

The present invention relates generally to semiconductor integrated circuit (IC) device fabrication technology and, more particularly, to a semiconductor IC device having a silicide-blocking layer and a related fabrication method.

2. Description of the Related Art

Metal oxide silicon (MOS) transistor, one of the field effect transistors (FETs), is generally composed of a gate placed on a silicon substrate and source/drain regions formed in the substrate at both sides of the gate. According to channel type, MOS transistors are classified into NMOS and PMOS. In addition, there is CMOS (complementary MOS) transistor in which both NMOS and PMOS transistors are formed together in the identical substrate.

In fabrication of such MOS transistors, one of the critical issues is contact resistance between the gate or the source/drain region and metal layers. Silicide, alloys of silicon and metals, has been introduced as contact materials to reduce the contact resistance and thus to improve electrical properties of MOS transistors. Silicide combines the advantageous features of metal contacts (e.g., significantly lower resistivity than polysilicon) and polysilicon contacts (e.g., no electromigration). Silicide may be formed from a variety of metals such as titanium (Ti), cobalt (Co), vanadium (V), chromium (Cr), zirconium (Zr), niobium (Nb), molybdenum (Mo), hafnium (Hf), etc.

As well known in the art, a silicide layer is formed by salicide (i.e., self-aligned silicide) process in which the silicide contacts are formed only in those areas where deposited metal is in direct contact with silicon, and hence self-aligned contacts are obtained.

FIG. 1 shows, in a cross-sectional view, a convention semiconductor device having a suicide layer. Referring to FIG. 1, a field oxide layer 11 is formed in a silicon substrate 10 to define an active region, and a well region 12 is formed in the substrate 10. A gate oxide layer 13 and a gate electrode 14 are then formed on the substrate 10, and low doping parts 15a of source/drain regions 15 are formed in the substrate 10. Dielectric spacers 16 are formed on sidewalls of the gate electrode 14, and high doping parts 15b of the source/drain regions 15 are formed in the substrate 10. Then a suitable metal layer is conformally deposited and subjected to annealing. As a result, a silicide layer 17 is formed on both the gate electrode 14 and the source/drain regions 15.

Such a silicide layer 17 may, however, have the following drawbacks. In a blanket etching process of forming the spacers 16, the field oxide layer 11 may be often damaged at the edges thereof as shown in FIG. 2. Hence the edges of the field oxide layer 11 are relatively lowered than the adjacent source/drain regions 15. That is, the source/drain regions 15 are partly exposed at the edges of the field oxide layer 11. Therefore, the silicide layer 17 may be unfavorably extended to the exposed portion of the source/drain regions 15. This extended portion of the silicide layer 17 may provide a path of leakage current, consequently degrading the characteristic of the device.

SUMMARY OF THE INVENTION

Exemplary, non-limiting embodiments of the present invention provide a semiconductor device having a silicide-blocking layer and a method of fabricating such a semiconductor device.

According to one exemplary embodiment of the present invention, the semiconductor device comprises a silicon substrate having a field oxide layer formed therein to define an active region, source/drain regions formed in the active region of the substrate, a gate oxide layer and a gate electrode formed on the substrate between the source/drain regions, dielectric spacers formed on sidewalls of the gate electrode, and a silicide layer formed on both the gate electrode and the source/drain regions. The semiconductor device further comprises a silicide-blocking layer formed over the border between the field oxide layer and the source/drain regions. The silicide-blocking layer covers edges of the source/drain regions, obstructing the extension of the silicide layer.

In the device, the edges of the source/drain regions may be higher than edges of the field oxide layer, and the silicide-blocking layer may cover the higher edges of the source/drain regions.

According to one exemplary embodiment of the present invention, the method comprises forming a field oxide layer in a silicon substrate to define an active region, forming a gate oxide layer and an overlying gate electrode on the active region of the substrate, forming dielectric spacers on sidewalls of the gate electrode, forming source/drain regions in the active region of the substrate, forming a silicide-blocking layer over the border between the field oxide layer and the source/drain regions, and forming a silicide layer on both the gate electrode and the source/drain regions except the blocking layer.

In the method, the forming of the silicide-blocking layer may include depositing an insulating layer over the substrate and selectively etching the insulating layer. The silicide-blocking layer may be formed of silicon oxide or silicon nitride. The silicide-blocking layer may be formed of the same material as the dielectric spacers.

DETAILED DESCRIPTION OF EXEMPLARY EMBODIMENTS OF THE INVENTION

An exemplary, non-limiting embodiment of the present invention will now be described more fully hereinafter with reference to the accompanying drawings. This invention may, however, be embodied in many different forms and should not be construed to be limited to the exemplary embodiment set forth herein. Rather, the disclosed embodiment is provided so that this disclosure will be thorough and complete, and will fully convey the scope of the invention to those skilled in the art. The principles and features of this invention may be employed in varied and numerous embodiments without departing from the scope of the invention.

In is noted that well-known structures and processes are not described or illustrated in detail to avoid obscuring the essence of the present invention. It is also noted that the figures are not drawn to scale.

Figure 1:
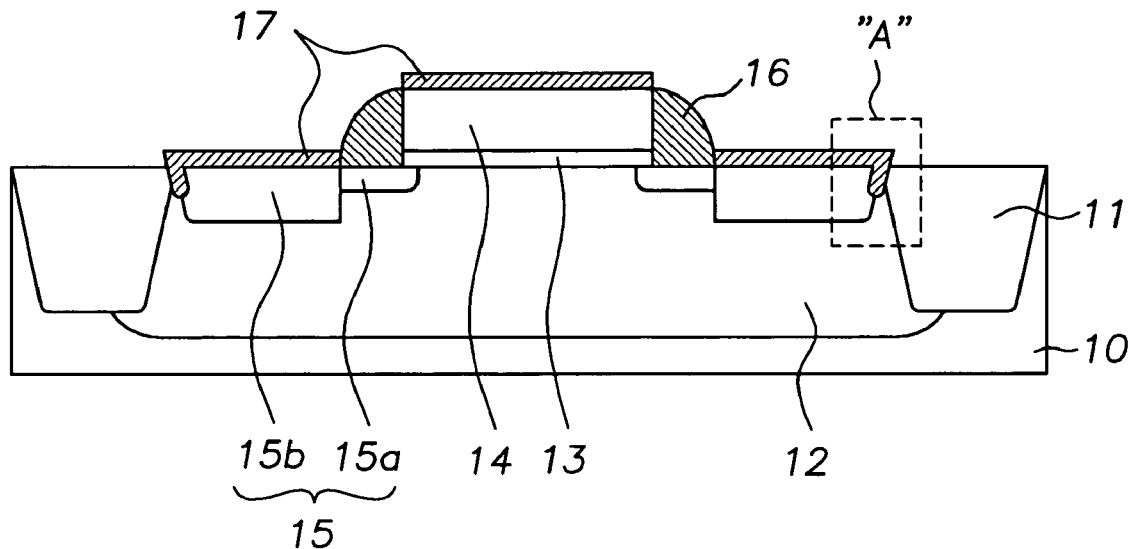
FIG. 1 is a cross-sectional view showing a conventional semiconductor device having a silicide layer.
Figure 2:
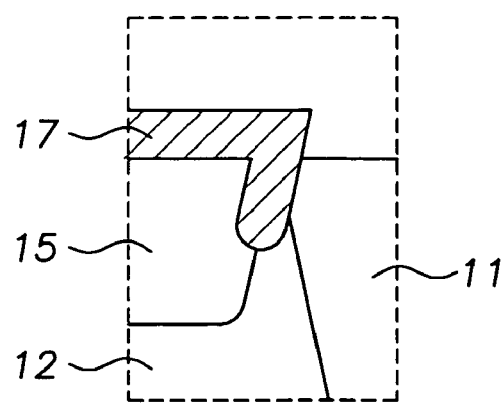
FIG. 2 is an enlarged view of section "A" of FIG. 1.
Figure 3:
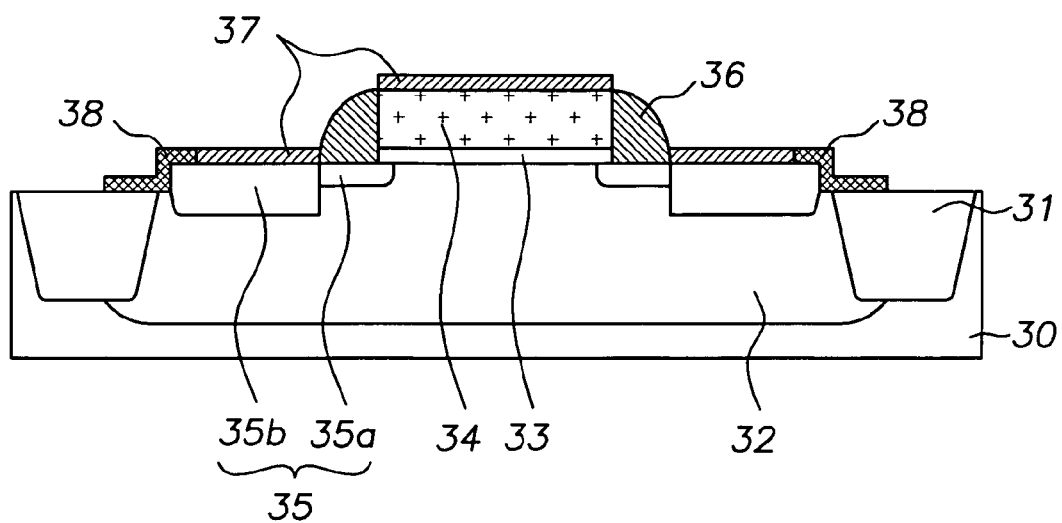
FIG. 3 is a cross-sectional view showing a semiconductor device having a silicide-blocking layer in accordance with an exemplary embodiment of the present invention.

FIG. 3 is a cross-sectional view showing a semiconductor device having a silicide-blocking layer in accordance with an exemplary embodiment of the present invention.

Referring to FIG. 3, a silicon substrate 30 has a field oxide layer 31 formed therein to define an active region. Further formed in the substrate 30 are a well region 32 and source/drain regions 35. A gate oxide layer 33 and a gate electrode 34 are formed on the substrate 30 between the source/drain regions 35. Dielectric spacers 36 are formed on sidewalls of the gate electrode 34. The source/drain regions 35 have low doping parts 35a and high doping parts 35b. A silicide layer 37 is formed on both the gate electrode 34 and the source/drain regions 35. In addition, a silicide-blocking layer 38 is formed over the border between the field oxide layer 31 and the source/drain regions 35. The silicide-blocking layer 38 covers edges of the source/drain regions 35 and obstructs the extension of the suicide layer 37.

FIGS. 4A to 4E are cross-sectional views illustrating a method of fabricating the semiconductor device shown in FIG. 3.

Figure 4A:
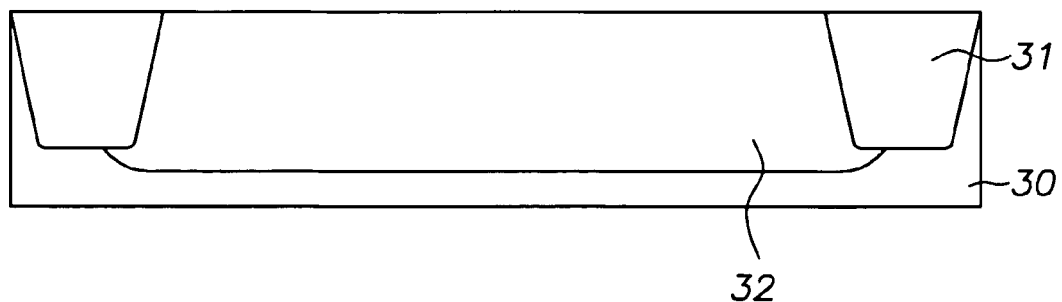
FIGS. 4A to 4E are cross-sectional views illustrating a method of fabricating the semiconductor device shown in FIG. 3.

Referring to FIG. 4A, the field oxide layer 31 is partially formed in the silicon substrate 30 to define the active region. Typical STI (shallow trench isolation) technique is often used for forming the field oxide layer 31. The well region 32 is then formed in the substrate 30 by using well-known ion implantation.

Figure 4B:
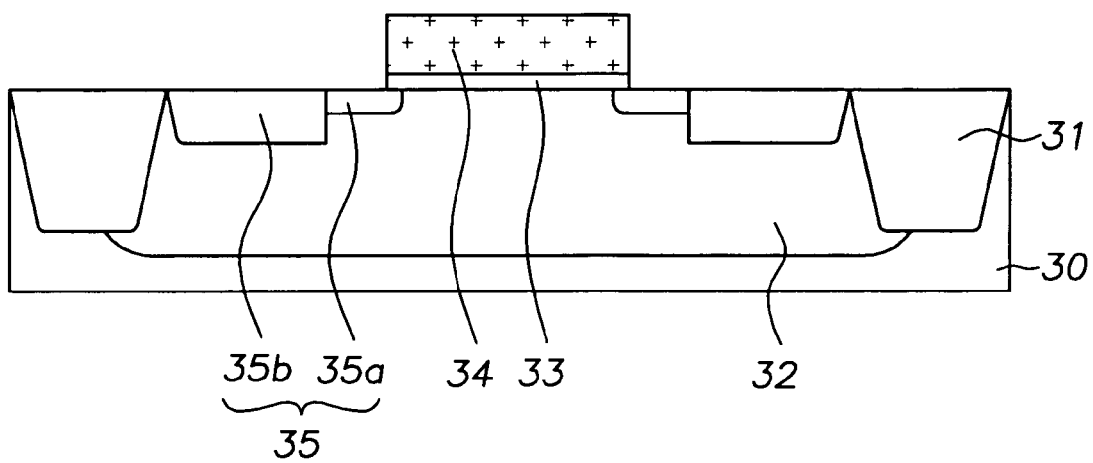

Next, referring to FIG. 4B, the gate oxide layer 33 is thermally grown on the substrate 30 and a gate conductor layer such as polysilicon is deposited thereon. The gate conductor layer is then etched together with the gate oxide layer 33 to form the gate electrode 34. The low doping part 35a of the source/drain regions 35 is formed in the active region of the substrate 30, using the gate electrode 34 as an implant mask.

Figure 4C:
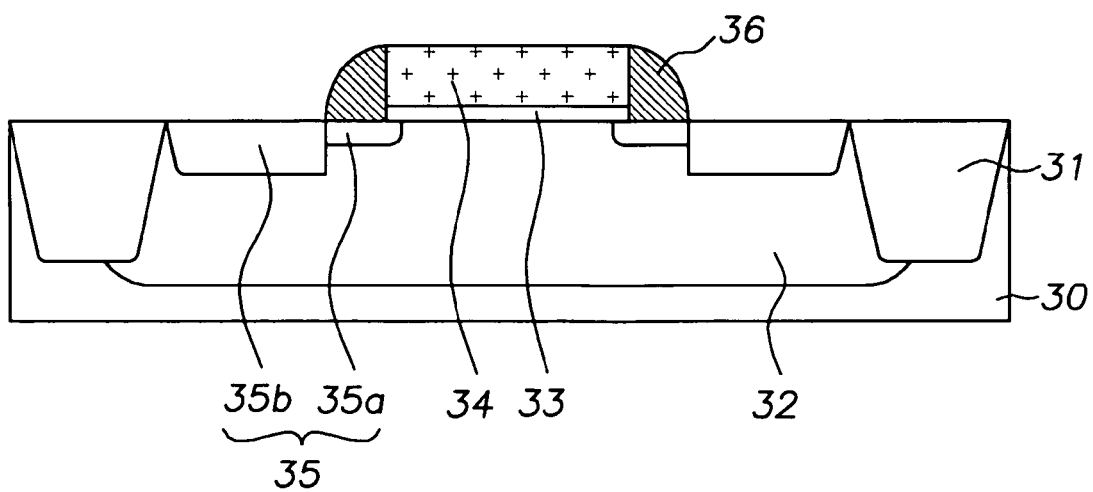

Next, referring to FIG. 4C, suitable dielectric material is deposited over the substrate 30 and blanket-etched. Consequently, the dielectric spacers 36 are formed on sidewalls of the gate electrode 34. Then the high doping part 35b of the source/drain regions 35 is further formed in the active region of the substrate 30, using both the spacers 36 and the gate electrode 34 as an implant mask. While the blanket etching is performed, the field oxide layer 31 may be damaged at edges thereof as discussed above. Hence the edges of the adjacent source/drain regions 35 become higher than the edges of the field oxide layer 31, being partly exposed.

Figure 4D:
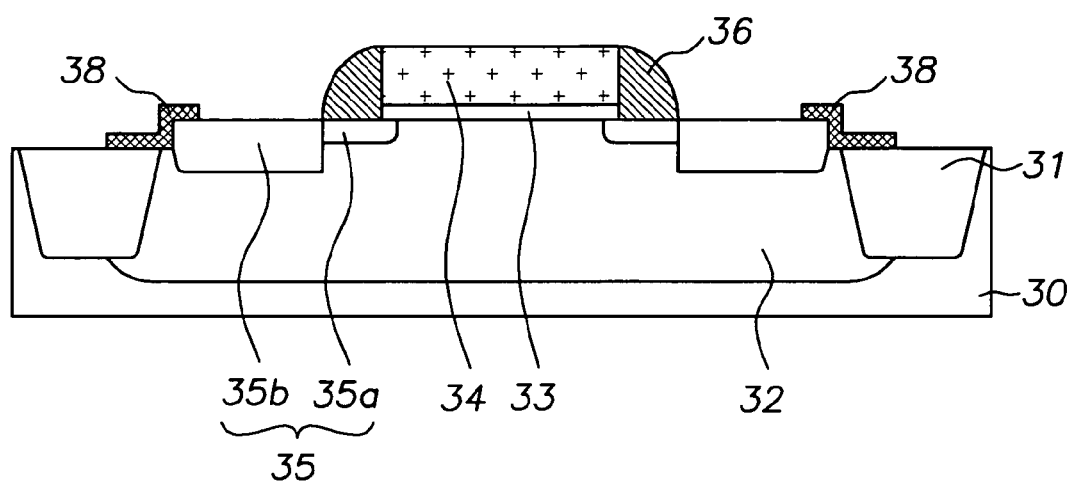

Referring to FIG. 4D, an insulating layer of silicon oxide or silicon nitride is deposited to cover the substrate 30 and then selectively etched. Thus, the silicide-blocking layer 38 is formed over the border between the field oxide layer 31 and the source/drain regions 35, covering the exposed higher edges of the source/drain regions 35. Therefore, in the subsequent salicide process, the blocking layer 38 prevents the silicide layer from being formed on the edges of the source/drain regions 35. In an alternative embodiment, the silicide-blocking layer 38 may be simultaneously formed during the spacer formation discussed earlier. In this case, the blocking layer 38 may be formed of the same material as the dielectric spacers 36.

Figure 4E:
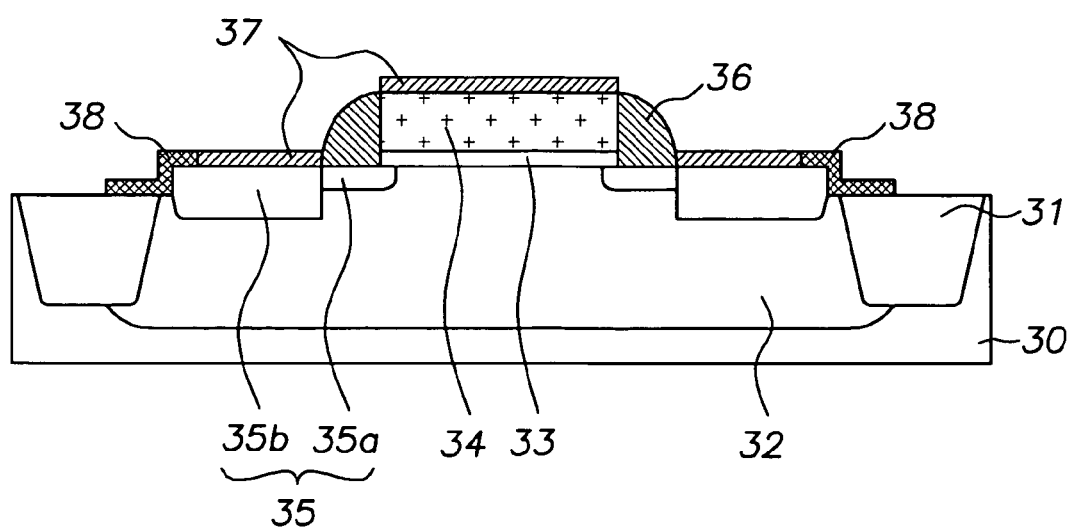

FIG. 4E shows the suicide layer 37. To form the silicide layer 37, an adequate metal layer is conformally deposited over the substrate 30 and then subjected to annealing. As a result, the silicide layer 37 is formed on both the gate electrode 34 and the source/drain regions 35 except the blocking layer 38.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A semiconductor device comprising:
   a silicon substrate having a field oxide layer formed therein to define an active region;
   source/drain regions formed in the active region of the substrate;
   a gate oxide layer and a gate electrode formed on the substrate between the source/drain regions;
   dielectric spacers formed on sidewalls of the gate electrode;
   a silicide layer formed on both the gate electrode and the source/drain regions; and
   a silicide-blocking layer formed over the borders between the field oxide layer and the source/drain regions, covering edges of the source/drain regions, and obstructing the extension of the silicide layer.

2. The device of claim 1, wherein the edges of the source/drain regions are higher than edges of the field oxide layer, and the silicide-blocking layer covers the higher edges of the source/drain regions.

3. A method of fabricating a semiconductor device, the method comprising:
   forming a field oxide layer in a silicon substrate to define an active region;
   forming a gate oxide layer and an overlying gate electrode on the active region of the substrate;
   forming dielectric spacers on sidewalls of the gate electrode;
   forming source/drain regions in the active region of the substrate;
   forming a silicide-blocking layer over the borders between the field oxide layer and the source/drain regions; and
   forming a silicide layer on both the gate electrode and the source/drain regions except the blocking layer.

4. The method of claim 3, wherein the forming of the silicide-blocking layer includes depositing an insulating layer over the substrate and selectively etching the insulating layer.

5. The method of claim 3, wherein the silicide-blocking layer is formed of silicon oxide or silicon nitride.

6. The method of claim 3, wherein the silicide-blocking layer is formed of the same material as the dielectric spacers.

* * * * *